United States Patent [19]
Brown et al.

[11] Patent Number: 6,157,547
[45] Date of Patent: Dec. 5, 2000

[54] ELECTROMAGNETIC INTERFERENCE SHIELDING FILTER APPARATUS AND METHOD

[75] Inventors: Cass A. Brown, Arlington Heights; Dane L. Greives, Buffalo Grove, both of Ill.

[73] Assignee: 3COM Corporation, Rolling Meadows, Ill.

[21] Appl. No.: 09/086,278

[22] Filed: May 28, 1998

[51] Int. Cl.[7] .................................................. H05K 9/00
[52] U.S. Cl. ......................... 361/818; 361/800; 174/32; 333/12
[58] Field of Search .................... 361/683, 685, 361/686, 687, 694, 695, 752, 753, 796, 800, 816, 818, 825; 174/35 R, 32; 333/12, 181

[56] References Cited

U.S. PATENT DOCUMENTS

| | | |
|---|---|---|
| 4,307,431 | 12/1981 | Sone et al. . |
| 4,567,318 | 1/1986 | Shu . |
| 4,628,412 | 12/1986 | Nigorikawa . |
| 4,685,034 | 8/1987 | Tetsu et al. . |
| 4,734,541 | 3/1988 | Moran, Jr. . |
| 4,777,455 | 10/1988 | Sakamoto et al. . |
| 4,816,612 | 3/1989 | Yeom . |
| 5,001,298 | 3/1991 | Jong . |
| 5,153,380 | 10/1992 | Chang . |
| 5,182,696 | 1/1993 | Her . |
| 5,329,687 | 7/1994 | Scott et al. . |
| 5,349,132 | 9/1994 | Miller et al. ........................ 174/35 R |
| 5,443,390 | 8/1995 | Kokkosoulis et al. . |
| 5,515,240 | 5/1996 | Rodeffer et al. . |
| 5,625,535 | 4/1997 | Hulsebosch et al. ................... 361/719 |
| 5,694,294 | 12/1997 | Ohashi et al. ........................ 361/687 |

*Primary Examiner*—Jayprakash N. Gandhi
*Attorney, Agent, or Firm*—Baniak Nicholas Pine & Gannon

[57] ABSTRACT

An electromagnetic interference (EMI) shielding apparatus includes at least one power filter module having a power filter mounted within a housing. The power filter module includes a plurality of input terminals extending outward from a front wall of the housing and a plurality of output cables extending from a side wall of the housing and oriented perpendicular from the front wall. A chassis houses at least one circuit board and includes at least one input terminal opening formed therein to receive the input terminals. The input terminals extend outward from the chassis to allow the power cables to attach to the input terminals. The chassis is in contact with the front wall to prevent EMI emissions from exiting the chassis through the input terminals.

12 Claims, 3 Drawing Sheets

ELECTROMAGNETIC INTERFERENCE SHIELDING FILTER APPARATUS AND METHOD

FIELD OF THE INVENTION

This invention relates generally to the field of electronic power filters used in a chassis which house electronic components. In particular, the invention relates to a power filter module and chassis configuration which reduces electromagnetic interference (EMI) and provides a convenient means to fasten the power filter module to the chassis.

BACKGROUND OF THE INVENTION

Electronic devices for high speed telecommunication and networking applications are typically housed in a metal chassis. Power is typically routed to the chassis by input power cables. The input power cables may, however, introduce unwanted noise and other transients into the chassis. To overcome this problem, a power line filter (i.e., RFI Filter) is mounted within the chassis to provide filtered power to the chassis. These filters are typically housed in a metal housing having input terminals or lugs which extend through a side wall, and output terminals which extend through the opposite side wall. The input power cables are typically attached directly to the input terminals. One end of the output cables is attached to the output terminals and the other end is attached to a backplane printed circuit board to supply filtered power to the electronic components mounted within the chassis.

One disadvantage of this arrangement is that EMI emissions generated within the chassis may exit the chassis via the input terminals and power cables because the input terminals are not isolated from EMI emissions generated by the high frequency electronics within the chassis. Moreover, the installation of these existing power filters requires several fastening components and is therefore labor intensive which increases manufacturing costs.

Accordingly, it would be desirable to have an EMI shielding filter apparatus that overcomes the disadvantages described above, and to provide a simple and cost effective EMI shielding filter apparatus.

SUMMARY OF THE INVENTION

One aspect of the invention provides an electromagnetic interference (EMI) shielding apparatus including at least one power filter module having a power filter mounted within a housing. The power filter module includes a plurality of input terminals extending outward from a front wall of the housing, and a plurality of output cables extending from a side wall of the housing and oriented perpendicular from the front wall. A chassis houses at least one circuit board and includes at least one input terminal opening formed therein to receive the input terminals. The input terminals extend outward from the chassis to allow the power cables to attach to the input terminals. The chassis is in contact with the front wall. The chassis may preferably include a bracket wherein the at least one input terminal opening is formed in the bracket. The bracket may preferably include a plurality of fastener openings formed therein. The plurality of input terminals may preferably extend outward from a plane defined by a front wall of the bracket. The housing may preferably include a flange portion extending perpendicular from the side wall including at least one flange opening for securing the power filter module to the chassis. The output cables may preferably be operatively connected to the circuit board. The output cables may preferably include a first and second pair of cables, the first pair operatively connected to the circuit board and the second pair operatively connected to a fan assembly mounted within the chassis.

Another aspect of the invention provides a method for operating an electromagnetic interference (EMI) shielding apparatus. At least one power filter module including a power filter mounted within a housing is provided. The power filter module includes a plurality of input terminals extending outward from a front wall of the housing and a plurality of output cables extending from a side wall of the housing and oriented perpendicular from the front wall. A chassis houses at least one circuit board and includes at least one input terminal opening formed therein. The input terminals extend outward from the chassis. The chassis is in contact with the front wall. The input terminal is inserted into the at least one input terminal opening. The chassis is contacted against the housing. The chassis may also include a removable bracket which includes the at least one input terminal opening. The input terminals may preferably be inserted through the at least one input terminal opening in the bracket. The bracket may be secured to the front wall of the housing. The bracket may be secured to a back portion of the chassis. The output cables may preferably be connected to the circuit board. A power cable may secured to the input terminals. The power cable may preferably be a DC power cable.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
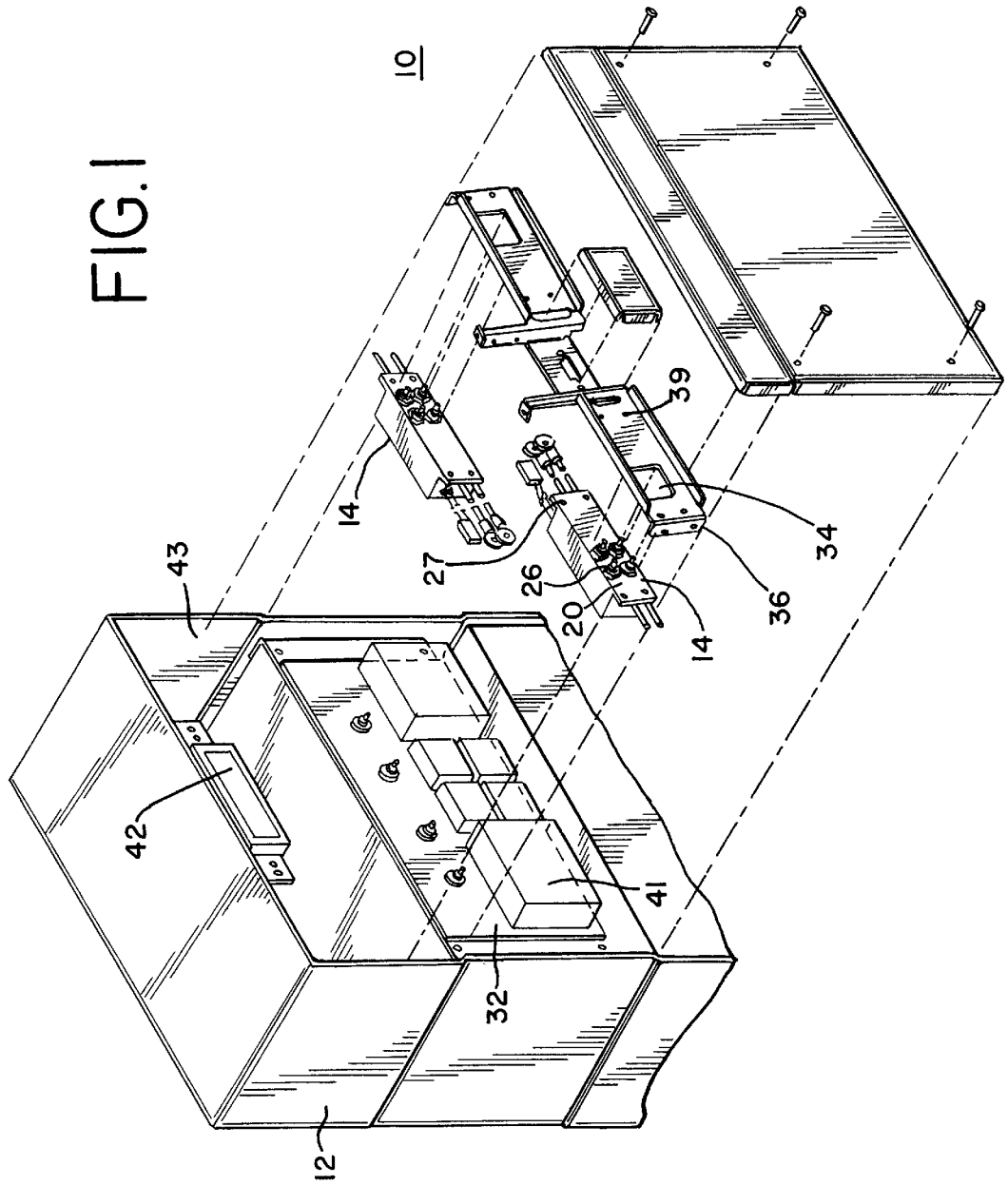
FIG. 1 is a perspective exploded view of a preferred embodiment of an electromagnetic interference (EMI) shielding apparatus which is made in accordance with the invention.
Figure 2:
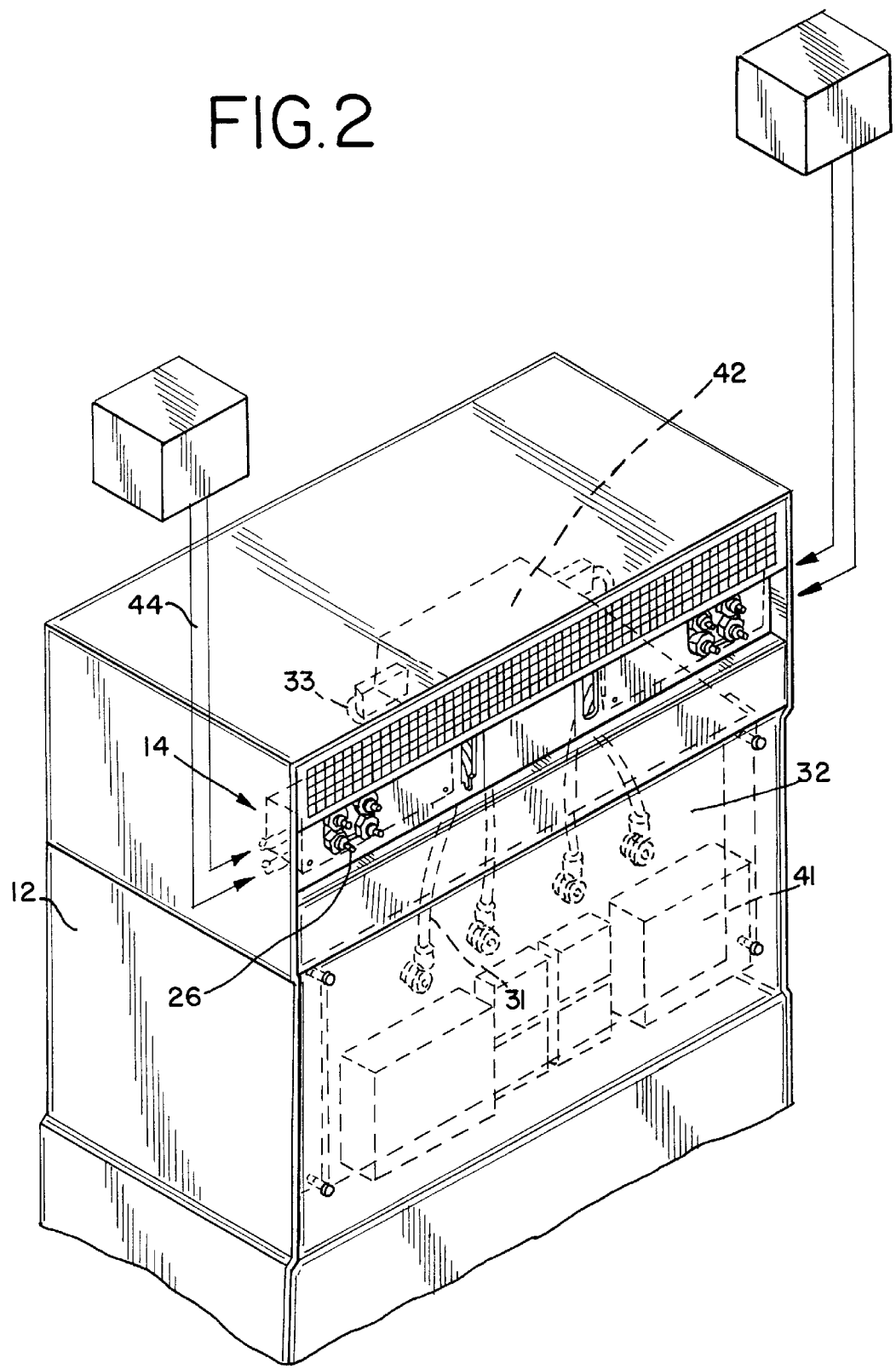
FIG. 2 is an assembled view of FIG. 1.
Figure 3:
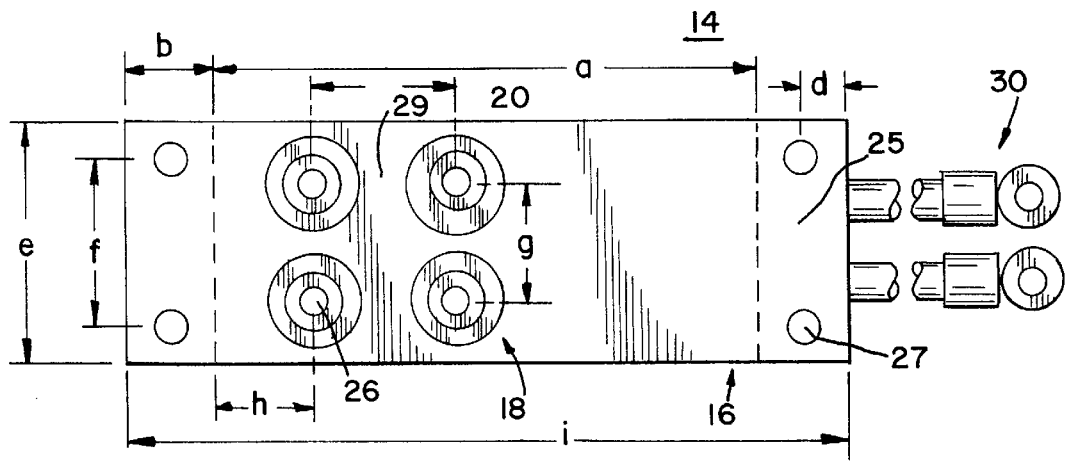
FIG. 3 is a front view of the power filter module of the embodiment of FIG. 1.
Figure 4:
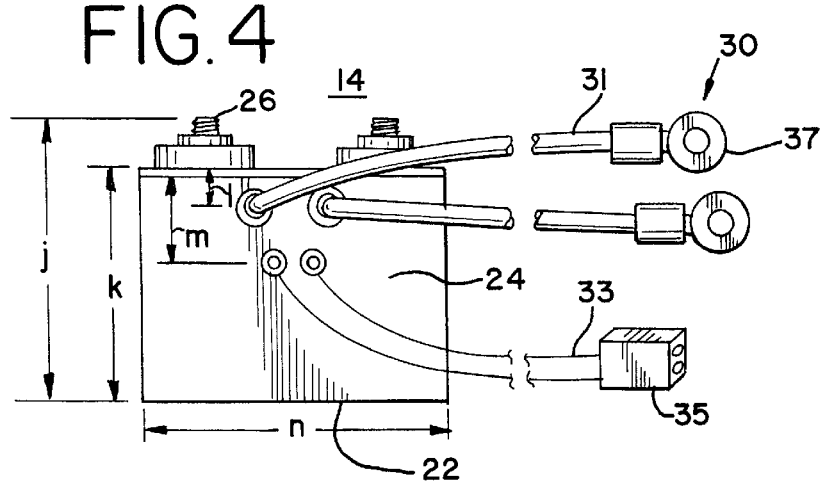
FIG. 4 is an end view of the power filter module of FIG. 2.
Figure 5:
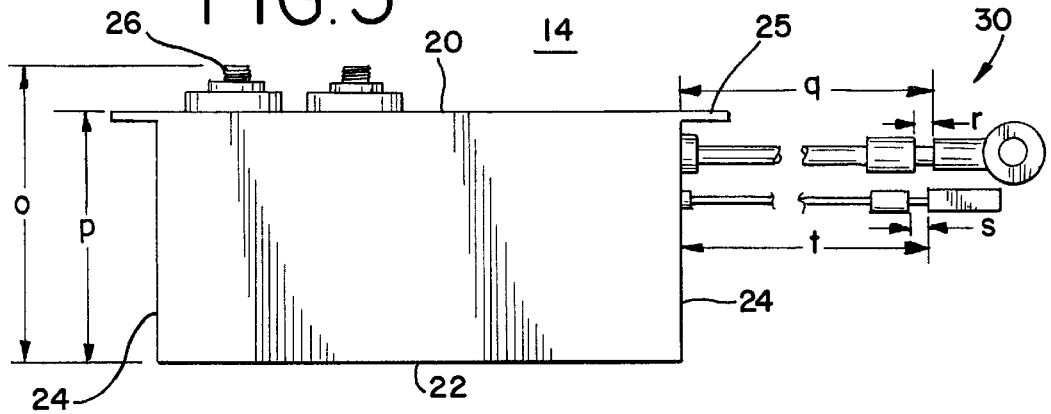
FIG. 5 is a top view of the power filter module of FIG. 3.

As shown in FIGS. 1–2, a preferred embodiment of an electromagnetic interference (EMI) shielding apparatus 10 includes a chassis 12 and a power filter module 14. In the embodiment shown, two power filter modules 14 are provided. As shown in FIGS. 3–5, the power filter module 14 includes a housing 16 and a power filter 18 mounted within the housing 16. The power filter 18 may be any of the commercially available power line filters suitable for reducing EMI emissions such as, for example, radio frequency noise.

As shown in FIGS. 3–5, the housing 16 of the power filter module 14 includes a front wall 20, a back wall 22, and two side walls 24. The housing 16 may be comprised of any suitable rigid material suitable for housing the power filter 18 including, for example, metal. The housing 16 may preferably be a two piece box-shaped housing which is generally rectangular in shape, although various configurations and shapes are contemplated. The dimensions of the housing 16 may be, for example, a=4.40 inches, b=0.550 inches, c=0.625 inches, d=0.275 inches, e=1.50 inches, f=1.00 inches, g=0.625 inches, h=0.85 inches, i=5.50 inches, j=2.25 inches, k=1.675 inches, l=0.5 inches, m=1.0 inches, n=1.50 inches, o=2.25 inches, p=1.675 inches, q=8.0 inches, r=1.00 inches, s=0.5 inches, and t=4.0 inches. The housing 16 may preferably include a flange portion 25 extending perpendicular from the side wall 24. In the embodiment shown, the flange portion 25 extends outward and perpendicular from the side wall 24. The flange portion 25 may preferably include at least one flange opening 27 for securing the power filter module 16 to the chassis 12. In the embodiment shown, four flange openings 27 are provided, although the number of flange openings 27 may vary. The advantage of this configuration is that the power filter module 14 can be easily and quickly mounted to the chassis 12 without having to use additional fastening components. This reduces the installation time which results in reduced manufacturing costs.

In the embodiment shown in FIGS. 3–5, a plurality of input terminals 26 extend outward and perpendicular from the front wall 20 of the housing 16 to allow power cables 44 (see FIG. 2) to be attached to the input terminals 26. In the embodiment shown, four input terminals 26 are provided, although the number of input terminals 26 may vary depending on the particular application. Each of the input terminals 26 may be comprised of, for example, #10 metal studs. As shown in FIG. 3, the input terminals 26 may preferably be positioned on an end portion 29 of the front wall 20.

As shown in FIGS. 3–5, a plurality of output cables 30 extend outward from a side wall 24 of the housing 16. In the embodiment shown, the output cables 30 are oriented perpendicular from the front wall 20. As shown in FIG. 4, the output cables 30 may preferably include a first pair 31 and a second pair 33 of flexible cables. Each of the first pair 31 of cables may include an insulated ring tongue terminal 37 such as those manufactured by Molex Inc., part number D-651-14X. The second pair 33 of cables may preferably be connected to a connector 35 such as, for example, a 2Position Mate-N-Lok manufactured by Amp Inc., Cap Part #: 172233-1, Terminal #: 700904-3.

The chassis 12 may be any suitable metal enclosure for housing electronic devices that carry out various functions such as, for example, telecommunications and networking functions. The chassis 12 may house various high speed application cards, switching cards, ingress and egress cards that may generate EMI emissions. As shown in FIG. 1, the chassis 12 includes at least one input terminal opening 34 formed therein to receive the input terminals 26. In the embodiment shown, two input terminal openings 34 are provided. Alternatively, the chassis 12 may preferably include a removable bracket 36 wherein the input terminal openings 34 are formed in the bracket 36. The bracket 36 may preferably include a plurality of brackets openings 39 to allow the filter module 14 to be mounted to the bracket 36. The chassis 12 also includes at least one circuit board 32 such as, for example, a backplane printed circuit board. A plurality of electronic components 41 may preferably be mounted onto the printed circuit board 32. A fan assembly 42 may preferably be mounted within the chassis 12.

In operation, a user may insert the input terminals 26 through the input terminal openings 34 of the bracket 36 (see FIGS. 1–2). The bracket 36 is positioned so that it contacts against the front surface 20 of the housing 16. The bracket 36 is secured to the front surface 20 of the housing 16 by inserting mechanical fasteners through the bracket openings 39 and the flange openings 27. The mechanical fasteners may include, for example, screws, bolts or other conventional fasteners. The bracket 36 may then be secured to a back portion 43 of the of the chassis 12 by any conventional means. The first pair of cables 31 may preferably be connected to the backplane printed circuit board 32 to provide power to the electronic components within the chassis 12. The second pair of cables 33 may preferably be connected to the fan assembly 42 mounted within the chassis 12. Input power cables 44 may be preferably be connected to the input terminals 26 to provide power to the chassis 12. The input power cables 44 may preferably be DC power cables. The advantage of this configuration is that the input terminals 26 are isolated from the output cables 31, 33 and the electronic components mounted within the chassis 12. As a result, the input terminals 26 are electronically shielded from EMI emissions generated by the electronic components housed within the chassis 12. This prevents EMI emissions from exiting the chassis 12.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An electromagnetic interference (EMI) shielding apparatus comprising:

at least one power filter module including a power filter mounted within a housing, the power filter module including a plurality of input terminals extending outward from a front wall of the housing, and a plurality of output cables extending from a side wall of the housing and oriented perpendicular from the front wall to isolate the plurality of output cables from the plurality of input terminals, a chassis housing at least one circuit board, the chassis including at least one input terminal opening formed therein to receive the input terminals, the input terminals extending outward from the chassis to allow power cables to attach to the input terminals, the chassis in contact with the front wall.

2. The apparatus of claim 1 wherein the chassis includes a bracket, the at least one input terminal opening formed in the bracket.

3. The apparatus of claim 2 wherein the bracket includes a plurality of fastener openings formed therein.

4. The apparatus of claim 2 wherein the plurality of input terminals extend outward from a plane defined by a front wall of the bracket.

5. The apparatus of claim 1 wherein the housing includes a flange portion extending perpendicular from the side wall and including at least one flange opening for securing the power filter module to the chassis.

6. The apparatus of claim 1 wherein the output cables are operatively connected to the circuit board.

7. The apparatus of claim 1 wherein the output cables include a first and second pair of cables, the first pair operatively connected to the circuit board and the second pair operatively connected to a fan assembly mounted within the chassis.

8. A method for operating an electromagnetic interference (EMI) shielding apparatus comprising:

providing at least one power filter module including a power filter mounted within a housing, the power filter module including a plurality of input terminals extending outward from a front wall of the housing, and a plurality of output cables extending from a side wall of the housing and oriented perpendicular from the front wall to isolate the plurality of output cables from the plurality of input terminals, a chassis housing at least one circuit board, the chassis including at least one input terminal opening formed therein, the input terminals extending outward from the chassis, the chassis in contact with the front wall;

inserting the input terminal into the at least one input terminal opening; and contacting the chassis against the housing.

9. The method of claim 8 wherein the chassis includes a removable bracket including the at least one input terminal opening;

inserting the input terminals through the at least one input terminal opening in the bracket;

securing the bracket to the front wall of the housing; and securing the bracket to a back portion of the chassis.

10. The method of claim 9 further comprising:

connecting the output cables to the circuit board.

11. The method of claim 10 further comprising:

securing a power cable to the input terminals.

12. The method of claim 11 wherein the power cable is a DC power cable.

* * * * *